United States Patent [19]

Ogihara et al.

[11] Patent Number: 4,931,992
[45] Date of Patent: Jun. 5, 1990

[54] SEMICONDUCTOR MEMORY HAVING BARRIER TRANSISTORS CONNECTED BETWEEN SENSE AND RESTORE CIRCUITS

[75] Inventors: Masaki Ogihara, Yokohama; Yoshio Okada, Tokyo; Syuso Fujii, Kawasaki, all of Japan

[73] Assignee: Kabushiki Kaisha Toshiba, Kanagawa, Japan

[21] Appl. No.: 310,020

[22] Filed: Feb. 9, 1989

Related U.S. Application Data

[63] Continuation of Ser. No. 463, Jan. 5, 1987, abandoned.

[30] Foreign Application Priority Data

Jan. 17, 1986 [JP] Japan .................................. 61-7271

[51] Int. Cl.$^5$ .............................................. G11C 7/00
[52] U.S. Cl. ............................. 365/189.11; 365/190; 365/205; 365/222
[58] Field of Search ............... 365/189, 190, 205, 207, 365/208, 222, 203, 149, 189.06, 189.11; 307/530

[56] References Cited

U.S. PATENT DOCUMENTS

| | | | |
|---|---|---|---|
| 4,003,035 | 1/1977 | Hoffman et al. | 365/205 |
| 4,169,233 | 9/1979 | Harastzi | 365/205 |
| 4,542,483 | 9/1985 | Procyk | 365/205 |
| 4,551,641 | 11/1985 | Pelley | 365/205 |
| 4,794,569 | 12/1988 | Sahara et al. | 365/205 |

FOREIGN PATENT DOCUMENTS 0189898 11/1983 Japan .................................. 365/205

OTHER PUBLICATIONS

Lu et al., "Half-VDD Bit-Line Sensing Scheme in CMOS DRAM's," IEEE Journal of Solid-State Circuits, vol. SC-19, No. 4, pp. 451-454, Aug. 1984.

*Primary Examiner*—Glenn A. Gossage
*Attorney, Agent, or Firm*—Finnegan, Henderson, Farabow, Garrett and Dunner

[57] ABSTRACT

A semiconductor memory comprises a memory cell for storing data, a bit line pair for transfering the data, a sense amplifier for amplifying the data from the bit line pair, a restore circuit directly connected to the bit line pair for restoring the data in the semiconductor memory, and a pair of constant voltage barrier transistors connected between the restore circuit and the sense amplifier for increasing the speed of sensing.

11 Claims, 1 Drawing Sheet

SEMICONDUCTOR MEMORY HAVING BARRIER TRANSISTORS CONNECTED BETWEEN SENSE AND RESTORE CIRCUITS

This application is a continuation of application Ser. No. 071,000,463, filed Jan. 5, 1987, now abandoned.

BACKGROUND OF THE INVENTION

1. Field of the Invention

This invention relates to a semiconductor memory. In particular, the invention relates to the connection of the bit lines and the restore circuits in a memory which has barrier transistors between the bit lines and the sense amplifiers.

2. Description of the Related Art

As shown in FIG. 1, in conventional memories of this type, for instance the dynamic RAM (random access memory), barrier transistors T1 and T2 formed by N channel MOS transistors are inserted at one end of the bit line pair BL and $\overline{BL}$ of each column in the memory cell array 3. Restore circuit 1 and synchronized sense amplifier 2 are connected to the bit line pair section on the opposite side of the memory cell array 3 using barrier transistors T1 and T2 as a reference. This sense amplifier 2 operates the sense amplification and latch action by receiving synchronization signal $\phi 1$. A dummy cell circuit 4 and precharge equalizer circuit 5 are connected in series to the other end of the bit line pair BL and $\overline{BL}$.

As is well known, for reading the memory cell data in a dynamic RAM, sense amplifier 2 reads the slight difference in potential which is generated in the bit line pair BL and $\overline{BL}$ by amplifying it and determines data "1" or "0". However, a problem arises in that the more the integration of dynamic RAMs progresses, the greater becomes the load capacity of bit lines BL and $\overline{BL}$ and the longer the sensing time becomes. Therefore, to counteract this, a resistance component due to the barrier transistors T1 and T2 is inserted between bit lines BL and $\overline{BL}$ and sense amplifier 2 so that latching of the bit line potential by sense amplifier 2 is made faster.

A barrier control signal $\phi T$ is applied to the gates of barrier transistors T1 and T2. The potentials shown in the following Table are used for this signal $\phi T$ according to the bit line precharge system.

| Bit line precharge potential | Sensing | Restoring | Precharging |
|---|---|---|---|
| Vcc (Power source potential) | >Vcc + VT | >Vcc + VT | >Vcc + VT |
| Vss (Earth potential) | Vcc | >Vcc + VT | Vcc |
| Vcc/2 | Vcc | >Vcc + VT | Vcc |

Here, VT is the threshold voltage of barrier transistors T1 and T2. Accordingly, when restoring, it is necessary to make the bit line potential Vcc. Thus, at this time, in order to set barrier transistors T1 and T2 to the ON state, each system requires a greater potential than (Vcc+VT) as the $\phi T$ potential. In this case, in the Vss precharge system and the Vcc/2 system, it is necessary to step up the potential so that $\phi T$ is $\geq$ Vcc+VT during restoring, which is different from other periods.

In the conventional memories mentioned above, a voltage step-up circuit (not shown in the FIG. is required as a memory peripheral circuit in order to generate the control signal $\phi T$. This leads to accompanying problems in that the design and construction are more complicated, the area occupied on the memory chip surface is increased and, consequently, the area of the memory chip is increased.

SUMMARY OF THE INVENTION

An object of this invention is to provide a semiconductor memory in which the gate potential of the barrier transistors is constant, and to eliminate the need for a step-up circuit for the barrier transistor control signal. Thus, the design can be simplified, the circuit can be more easily constructed and the required chip surface area can be decreased.

The semiconductor memory of this invention has the characteristic of connecting restore circuits directly to a bit line pair by inserting MOS barrier transistors between the bit line sense amplifiers and the bit line pair and applying a constant potential to the gates of the barrier transistors.

In this way, there is no loss of efficiency from the insertion of the barrier transistors and therefore a step-up circuit for the barrier transistor control signal is no longer required.

DETAILED DESCRIPTION OF THE PREFERRED EMBODIMENTS

Figures 1, 2:
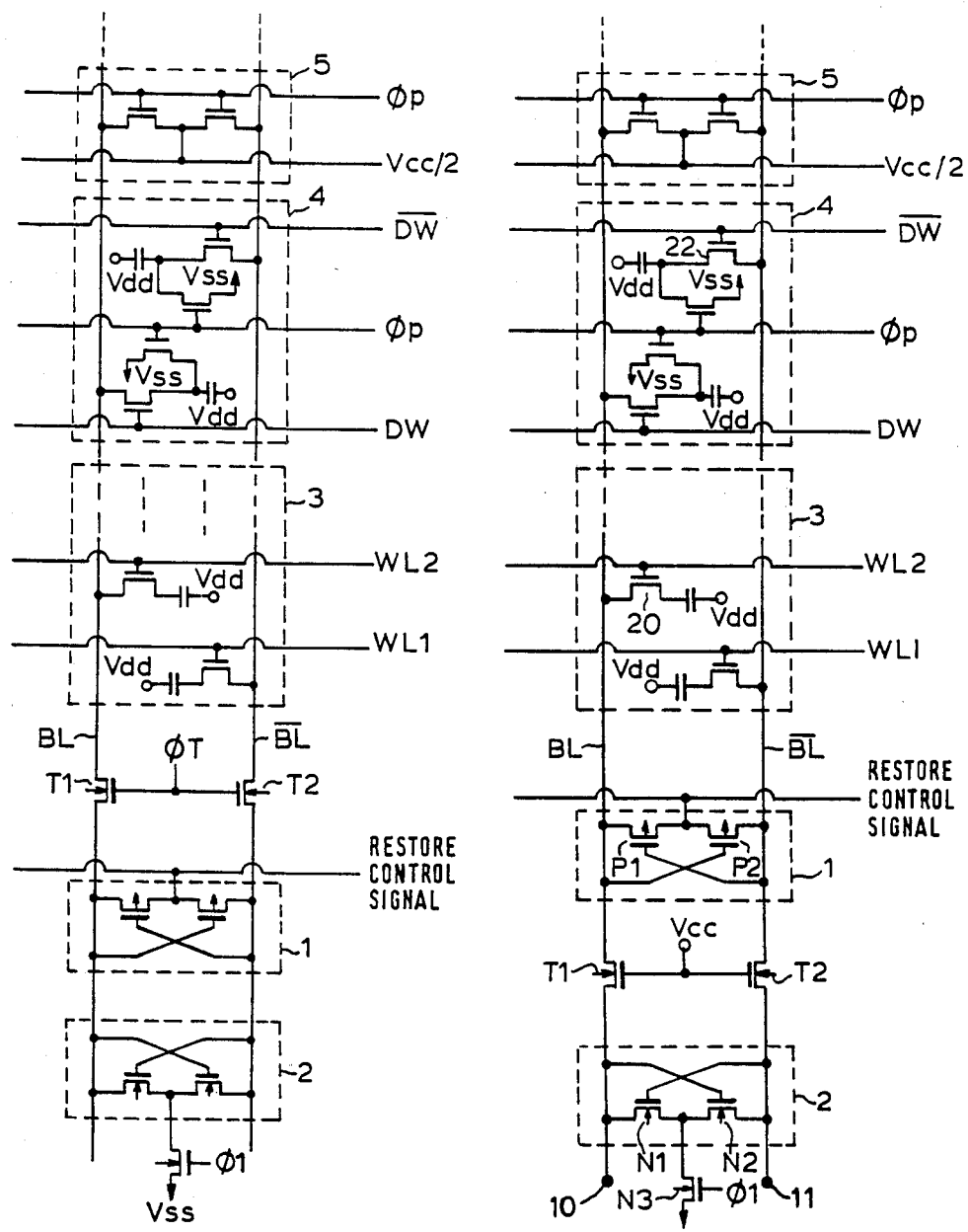
FIG. 1 is a circuit diagram showing a part of a conventional dynamic RAM.
FIG. 2 is a circuit diagram showing a part of a Vcc/2 precharge system dynamic RAM of an embodiment of this invention.

An embodiment of this invention is explained in detail below with reference to drawings.

FIG. 2 shows the circuit connections of restore circuit 1, barrier transistors T1 and T2 and synchronized sense amplifier 2 for the bit line pair BL and $\overline{BL}$ which correspond to 1 column in the memory cell array 3 of, for instance, a Vcc/2 precharge system dynamic RAM. The device of FIG. 1 differs from the circuit connections described above in two major respects. The first difference is that restore circuit 1 is directly connected to bit line pair BL and $\overline{BL}$ (that is to say, taking barrier transistors T1 and T2 as a reference, it is connected on the memory cell side). The second point is that a constant potential, for instance power source potential Vcc, is applied to the gates of barrier transistors T1 and T2. The same symbols as appear in FIG. 1 are used for the other components shown in FIG. 2.

This embodiment shows the case of a CMOS (complementary insulated gate) memory. Sense amplifier 2 is connected in such a way that two N channel enhancement MOS transistors N1 and N2, form a flipflop circuit. Thus, the operating and non-operating states are controlled by N channel enhancement MOS transistor N2 whose switching is in turn controlled by sense amplifier control signal $\phi 1$. Also, N channel enhancement MOS transistors are used for barrier transistors T1 and T2. Moreover, restore circuit 1 is connected in such a way that two P channel enhancement MOS transistors P1 and P2 form a flipflop circuit. Thus, the operating and non-operating states are controlled by the restore control signal.

The following are explanations of the operation of the above circuits.

(1) When precharge operates, since gate potential Vcc of barrier transistors T1 and T2 is higher than bit line precharge potential Vcc/2+threshold voltage VT of barrier transistors T1 and T2, barrier transistors T1 and T2 are in the ON states. Therefore no interference occurs to the bit line precharge operation through the precharge circuit 5.

(2) When the memory cell data is read, sense amplifier control signal $\phi 1$ becomes high level and sense amplifier 2 carries out sense amplification of the potential difference generated between bit line pair BL and $\overline{BL}$. This is the difference between the potential generated in one bit line BL through the holding charge of the memory cell 20 selected in accordance with the address input and the potential generated in this bit line $\overline{BL}$ by a selected dummy cell 22 which is connected to the other bit line $\overline{BL}$. Next, restore circuit 1 operates and restores the bit line pair. Since restore circuit 1 is installed directly on bit line pair BL and $\overline{BL}$, it is possible to step-up the bit line potential sufficiently to the required level of Vcc potential, even though the gate potential of barrier transistors T1 and T2 is only Vcc potential.

(3) When writing data to a memory cell, sense amplifier 2 is operated and the high/low relationship of the potentials of bit lines BL and $\overline{BL}$ is determined according to the write input data from the terminals 10 and 11. In this case, even if the selected memory data is reversed from "1" to "0" or from "0" to "1", when the potential relationship of bit lines BL and $\overline{BL}$ is reversed by sense amplifier 2, this bit line potential passes through barrier transistors T1 and T2 and reverses restore circuit 1. When it is possible to step up the bit line potential to Vcc potential by restore circuit 1.

Since, in the above memory, the gate potential of barrier transistors T1 and T2 can be set at Vcc potential, a barrier transistor control signal step-up circuit is no longer required. Therefore circuit design and pattern design are much simpler, circuit construction is easier and chip surface area can be decreased.

Moreover, by connecting restore circuit 1 directly to the bit line pair, since the load capacity of sense amplifier 2 is reduced at least by the capacity of restore circuit 1 compared with conventional examples, the sensing time of sense amplifier 2 becomes shorter (sensing becomes faster) because it is almost proportional to the load capacity.

Also, the resistance from restore circuit 1 to the far end of bit pair BL and $\overline{BL}$ in conventional circuits is large, since the resistance of the bit line itself and the resistance component of barrier transistors T1 and T2 are connected in series. However, in this embodiment this resistance component is only the resistance of the bit line. Therefore, because the restore time of the bit line is almost proportional to the above resistance, the restore time decreases in this embodiment in comparison to in conventional examples. As a result, it becomes possible to speed up the operation, particularly when data writing, and a speed-up of memory operation can be achieved.

This invention is not confined to the above embodiment. The same effect as in the embodiment can also be obtained even when the sense amplifier is constructed using P channel MOS transistors. In this case P channel MOS transistors are used for the barrier transistors and Vss potential (earth potential) is applied to their gates. Also, selection of an appropriate active level for the restore control signal makes restoring possible irrespective of whether P channel transistors or N channel transistors are used. This applies to all memories, whether they be NMOS memories, PMOS memories or CMOS memories.

As described above, when a semiconductor memory of this invention is used, a step-up circuit for the barrier transistor control signal is no longer required, because the restore circuit is connected directly to the bit line by providing barrier transistors between the sense amplifier and the restore circuit and applying a constant potential (Vcc potential or Vss potential) on their gates. Therefore, simplification of design and circuit construction can be achieved and the chip surface area can be made smaller. Furthermore, since sensing and restoring can be speeded up, this invention is suitable for high integration and large storage memories.

Various modifications and variations could be made to the invention without departing from the scope or spirit of the invention.

What is claimed is:

1. A semiconductor memory operable in response to a power source potential Vcc, comprising:
    a memory cell for storing data;
    a bit line pair for transferring the data;
    a sense amplifier to amplifying the data from the bit line pair and for sensing the data stored in the memory cell;
    a restore circuit directly connected to the bit line pair for restoring the data in the semiconductor memory; and
    barrier transistor means for increasing the speed of sensing, said barrier transistor means being connected between the sense amplifier and the restore circuit and having a gate and a constant gate potential sufficient to maintain an ON state.

2. The semiconductor memory according to claim 1, wherein the restore circuit comprises first and second MOS transistors forming a flipflop circuit controlled by a predetermined restore control signal.

3. The semiconductor memory according to claim 1 wherein the sense amplifier includes a plurality of MOS transistors of one conductivity type, and the barrier transistor means includes a plurality of barrier transistors of the same conductivity type.

4. The semiconductor memory according to claim 3 wherein the barrier transistors are N channel transistors and a Vcc power source potential is applied to the gates of the N channel transistors.

5. The semiconductor memory according to claim 3 wherein the barrier transistors are P channel transistors and earth potential is applied to the gates of the P channel transistors.

6. A semiconductor memory operable in response to a Vcc power source potential, comprising:
    a memory cell for storing data;
    a bit line pair for transferring the data;
    a precharge means for precharging the bit line pair to a potential of Vcc/2;
    a sense amplifier for amplifying the data from the bit line pair and for sensing the data stored in the memory cell;
    a restore circuit directly connected to the bit line pair for restoring the data in the semiconductor memory; and
    barrier transistor means for increasing the speed of sensing, said barrier transistor means being connected between the sense amplifier and the restore circuit and having a gate and a fixed gate potential sufficient to maintain an ON state.

7. The semiconductor memory according to claim 6 wherein the sense amplifier includes a plurality of MOS transistors of one conductivity type, and the barrier transistor means includes a plurality of barrier transistors of the same conductivity type.

8. The semiconductor memory according to claim 7 wherein the barrier transistors are N channel transistors and a Vcc power source potential is applied to the gates of the N channel transistors.

9. The semiconductor memory according to claim 7 wherein the barrier transistors are P channel transistors and earth potential is applied to the gates of the P channel transistors.

10. A semiconductor memory operable in response to a power source potential Vcc, comprising:
 a memory cell for storing data;
 a bit line pair for transferring the data;
 a sense amplifier for amplifying the data from the bit line pair and for sensing the data stored in the memory cell;
 a restore circuit directly connected to the bit line pair for restoring the data in the semiconductor memory; and
 barrier transistor means for increasing the speed of sensing and for transferring data from the sense amplifier to the bit line during a write operation, said barrier transistor means being connected between the sense amplifier and the restore circuit and having a gate and a gate potential sufficient to maintain an ON state.

11. A semiconductor memory operable in response to a power source potential Vcc, comprising:
 a memory cell for storing data;
 a bit line pair for transferring the data;
 a precharge means for precharging the bit line pair to a potential of substantially Vcc/2;
 a sense amplifier for amplifying the data from the bit line pair and for sensing the data stored in the memory cell;
 a restore circuit directly connected to the bit line pair for restoring the data in the semiconductor memory; and
 barrier transistor means for increasing the speed of sensing and for transferring data from the sense amplifier to the bit line during a write operation, said barrier transistor means being connected between the sense amplifier and the restore circuit and having a gate and a gate potential sufficient to maintain an ON state.

* * * * *

REEXAMINATION CERTIFICATE (3449th)
United States Patent [19]
Ogihara et al.

[11] B1 4,931,992
[45] Certificate Issued Mar. 3, 1998

[54] SEMICONDUCTOR MEMORY HAVING BARRIER TRANSISTORS CONNECTED BETWEEN SENSE AND RESTORE CIRCUITS

[75] Inventors: Masaki Ogihara, Yokohama; Yoshio Okada, Tokyo; Syuso Fujii, Kawasaki, all of Japan

[73] Assignee: Kabushiki Kaisha Toshiba, Kawasaki, Japan

Reexamination Request:
No. 90/004,696, Jul. 11, 1997

Reexamination Certificate for:
Patent No.: 4,931,992
Issued: Jun. 5, 1990
Appl. No.: 310,020
Filed: Feb. 9, 1989

Related U.S. Application Data

[63] Continuation of Ser. No. 463, Jan. 5, 1987, abandoned.

[30] Foreign Application Priority Data

Jan. 17, 1986 [JP] Japan ............................. 61-7271

[51] Int. Cl.$^6$ .................................................. G11C 7/00
[52] U.S. Cl. ................... 365/189.11; 365/190; 365/205; 365/222
[58] Field of Search ............... 365/189.11, 189.06, 365/190, 203, 205, 207, 208, 222, 149

[56] References Cited

U.S. PATENT DOCUMENTS 4,397,003  8/1983  Wilson et al. ........................... 365/205

FOREIGN PATENT DOCUMENTS 54-63632    5/1979    Japan.
58-189898   11/1983   Japan.
WO 81/02358 8/1981    WIPO.

OTHER PUBLICATIONS

Kung et al., "A Sub 100ns 256K DRAM in CMOS III Technology," IEEE International Solid–State Circuits Conference, Digest of Technical Papers, Feb. 1984, pp. 278–279, 354.

Spampinato, "Differential Sense Amplifier," IBM Technical Disclosure Bulletin, vol. 17, No. 6, Nov. 1974, pp. 1797–1798.

Schuster, "Sense Amplifier with Resistive Decoupling of Bit Lines," IBM Technical Disclosure Bulletin, vol. 23, No. 7A, Dec. 1980, pp. 3037–3038.

Tada et al., "Testing of Sense Amplifier in Dynamic Memory," International Test Conference, Digest of Papers, Nov. 1982, pp. 245–251.

Mohsen et al., "A 80ns 64K DRAM," IEEE International Solid–State Circuits Conference, Digest of Technical Papers, Feb. 1983, pp. 102–103.

*Primary Examiner*—Tan T. Nguyen

[57] ABSTRACT

A semiconductor memory comprises a memory cell for storing data, a bit line pair for transferring the data, a sense amplifier for amplifying the data from the bit line pair, a restore circuit directly connected to the bit line pair for restoring the data in the semiconductor memory, and a pair of constant voltage barrier transistors connected between the restore circuit and the sense amplifier for increasing the speed of sensing.

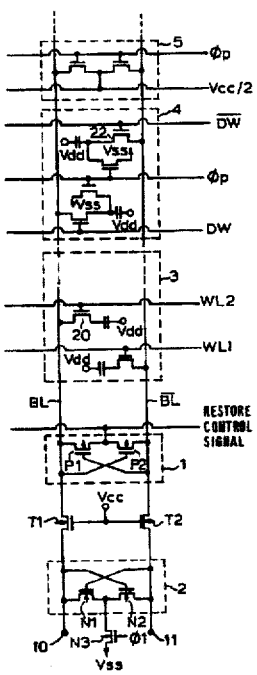

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 6–9 and 11 is confirmed.

Claim 1 is cancelled.

Claims 2, 3 and 10 are determined to be patentable as amended.

Claims 4 and 5, dependent on an amended claim, are determined to be patentable.

New claims 12–53 are added and determined to be patentable.

2. [The semiconductor memory according to claim 1] *A semiconductor memory operable in response to a power source potential Vcc, comprising:*
   *a memory cell, including an N-channel type transfer gate and a capacitor, for storing data;*
   *a bit line pair for transferring the data;*
   *a sense amplifier for amplifying the data from the bit line pair and for sensing the data stored in the memory cell;*
   *a restore circuit directly connected to the bit line pair for restoring the data in the semiconductor memory; and*
   *barrier transistor means for increasing the speed of sensing, said barrier transistor means being connected between the sense amplifier and the restore circuit and having a gate and a constant gate potential sufficient to maintain an ON state,*
   wherein the restore circuit comprises first and second MOS transistors forming a flipflop circuit controlled by a predetermined restore control signal.

3. [The semiconductor memory according to claim 1] *A semiconductor memory operable in response to a power source potential Vcc, comprising:*
   *a memory cell for storing data;*
   *a bit line pair for transferring the data;*
   *a sense amplifier for amplifying the data from the bit line pair and for sensing the data stored in the memory cell;*
   *a restore circuit directly connected to the bit line pair for restoring the data in the semiconductor memory; and,*
   *barrier transistor means for increasing the speed of sensing, said barrier transistor means being connected between the sense amplifier and the restore circuit and having a gate and a constant gate potential sufficient to maintain an ON state,*
   wherein the sense amplifier includes a plurality of MOS transistors of one conductivity type, and the barrier transistor means includes a plurality of barrier transistors of the same conductivity type; *and*
   *wherein the restore circuit includes a plurality of MOS transistors of another conductivity type which is opposite to the one conductivity type.*

10. A semiconductor memory operable in response to a power source potential Vcc, comprising:
    a memory cell for storing data;
    a bit line pair for transferring the data;
    a sense amplifier for amplifying the data from the bit line pair and for sensing the data stored in the memory cell;
    a restore circuit directly connected to the bit line pair for restoring the data in the semiconductor memory; and
    barrier transistor means for increasing the speed of sensing and for transferring data from the sense amplifier to the bit line during a write operation, said barrier transistor means being connected between the sense amplifier and the restore circuit and having a gate and a gate potential sufficient to maintain and ON state,
    wherein the restore circuit comprises first and second MOS transistors forming a flipflop circuit controlled by a predetermined restore control signal.

*12. The semiconductor memory according to claim 2 wherein the barrier transistor means receives the constant gate potential at the gate when the sense amplifier carries out sense amplification of a potential difference generated between the bit line pair.*

*13. The semiconductor memory according to claim 12 wherein the barrier transistor means further receives the constant gate potential at the gate when the restore circuit restores the bit line pair.*

*14. The semiconductor memory according to claim 2 further comprising a precharge means for precharging the bit line pair.*

*15. The semiconductor memory according to claim 14 wherein the precharge means precharges the bit line pair to a potential of Vcc/2.*

*16. The semiconductor memory according to claim 15 wherein the constant gate potential is higher than the potential of Vcc/2.*

*17. The semiconductor memory according to claim 16 wherein the constant gate potential is equal to Vcc.*

*18. The semiconductor memory according to claim 12 further comprising a precharge means for precharging the bit line pair.*

*19. The semiconductor memory according to claim 18 wherein the precharge means precharges the bit line pair to a potential of Vcc/2.*

*20. The semiconductor memory according to claim 19 wherein the constant gate potential is higher than the potential of Vcc/2.*

*21. The semiconductor memory according to claim 20 wherein the constant gate potential is equal to Vcc.*

*22. The semiconductor memory according to claim 13 further comprising a precharge means for precharging the bit line pair.*

*23. The semiconductor memory according to claim 22 wherein the precharge means precharges the bit line pair to a potential of Vcc/2.*

*24. The semiconductor memory according to claim 23 wherein the constant gate potential is higher than the potential of Vcc/2.*

*25. The semiconductor memory according to claim 24 wherein the constant gate potential is equal to Vcc.*

*26. The semiconductor memory according to claim 3 wherein the barrier transistor means receives the constant gate potential at the gate when the sense amplifier carries out sense amplification of a potential difference generated between the bit line pair.*

*27. The semiconductor memory according to claim 26 wherein the barrier transistor means further receives the* constant gate potential at the gate when the restore circuit restores the bit line pair.

28. The semiconductor memory according to claim 3 further comprising a precharge means for precharging the bit line pair.

29. The semiconductor memory according to claim 28 wherein the precharge means precharges the bit line pair to a potential of Vcc/2.

30. The semiconductor memory according to claim 29 wherein the constant gate potential is higher than the potential of Vcc/2.

31. The semiconductor memory according to claim 30 wherein the constant gate potential is Vcc.

32. The semiconductor memory according to claim 26 further comprising a precharge means for precharging the bit line pair.

33. The semiconductor memory according to claim 32 wherein the precharge means precharges the bit line pair to a potential of Vcc/2.

34. The semiconductor memory according to claim 33 wherein the constant gate potential is higher than the potential of Vcc/2.

35. The semiconductor memory according to claim 34 wherein the constant gate potential is equal to Vcc.

36. The semiconductor memory according to claim 27 further comprising a precharge means for precharging the bit line pair.

37. The semiconductor memory according to claim 36 wherein the precharge means precharges the bit line pair to a potential of Vcc/2.

38. The semiconductor memory according to claim 37 wherein the constant gate potential is higher than the potential of Vcc/2.

39. The semiconductor memory according to claim 38 wherein the constant gate potential is equal to Vcc.

40. The semiconductor memory according to claim 10 wherein the barrier transistor means receives the gate potential at the gate when the sense amplifier carries out sense amplification of a potential difference generated between the bit line pair.

41. The semiconductor memory according to claim 40 wherein the barrier transistor means further receives the gate potential at the gate when the restore circuit restores the bit line pair.

42. The semiconductor memory according to claim 10 further comprising a precharge means for precharging the bit line pair.

43. The semiconductor memory according to claim 42 wherein the precharge means precharges the bit line pair to a potential of Vcc/2.

44. The semiconductor memory according to claim 43 wherein the gate potential is higher than the potential of Vcc/2.

45. The semiconductor memory according to claim 44 wherein the gate potential is equal to Vcc.

46. The semiconductor memory according to claim 40 further comprising a precharge means for precharging the bit line pair.

47. The semiconductor memory according to claim 46 wherein the precharge means precharges the bit line pair to a potential of Vcc/2.

48. The semiconductor memory according to claim 47 wherein the gate potential is higher than the potential of Vcc/2.

49. The semiconductor memory according to claim 48 wherein the gate potential is Vcc.

50. The semiconductor memory according to claim 41 further comprising a precharge means for precharging the bit line pair.

51. The semiconductor memory according to claim 50 wherein the precharge means precharges the bit line pair to a potential of Vcc/2.

52. The semiconductor memory according to claim 51 wherein the gate potential is higher than the potential of Vcc/2.

53. The semiconductor memory according to claim 52 wherein the gate potential is equal to Vcc.

* * * * *